(12) United States Patent
Gross et al.

(10) Patent No.: US 6,606,729 B2
(45) Date of Patent: Aug. 12, 2003

(54) CORNER SIMULATION METHODOLOGY

(75) Inventors: Blaine J. Gross, Essex Junction, VT (US); Mukesh Kumar, Fairfax, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/682,613

(22) Filed: Sep. 27, 2001

(65) Prior Publication Data

US 2003/0066034 A1 Apr. 3, 2003

(51) Int. Cl.[7] .............................................. G06F 17/50
(52) U.S. Cl. ........................................................ 716/1
(58) Field of Search .................................. 716/1, 2–21

(56) References Cited

U.S. PATENT DOCUMENTS

| | | | | |
|---|---|---|---|---|
| 5,790,436 A | * | 8/1998 | Chen et al. ..................... | 716/5 |
| 5,901,063 A | * | 5/1999 | Chang et al. ................... | 716/4 |
| 6,130,173 A | * | 10/2000 | Esses ........................... | 430/316 |
| 6,407,611 B1 | * | 6/2002 | Larsen et al. ................. | 327/362 |
| 6,430,729 B1 | * | 8/2002 | Dewey et al. .................. | 716/4 |

\* cited by examiner

*Primary Examiner*—Matthew Smith
*Assistant Examiner*—Magid Y Dimyan
(74) *Attorney, Agent, or Firm*—Scully, Scott, Murphy & Presser; Richard Henkler, Esq.

(57) ABSTRACT

A method and system for creating a worst case scenario model for a given integrated circuit. The method comprises the steps of sorting skew parameters of each device into groups; and assigning a positive or negative value for each one of the groups to represent the effect of the corresponding skew parameters on the functionality of the integrated circuit. The preferred embodiment of the invention provides some of the benefits of both conventional corner simulation and Monte Carlo simulation. This approach can be implemented with only a few additional simulation iterations, which mitigates the disadvantage of Monte Carlo simulations requiring many simulation iterations. Also, this approach allows a greater degree of flexibility with respect to determining a specific corner file definition, allowing the designer to explore a greater area of model parameter space to insure that the circuit will meet performance requirements over extremes of process technology variation.

19 Claims, 2 Drawing Sheets

CORNER SIMULATION METHODOLOGY

BACKGROUND OF THE INVENTION

1. Field of the Invention

This invention generally relates to a simulation methodology for analog and RF circuits. More specifically, the invention relates to an improved corner simulation methodology for such circuits.

2. Prior Art

There are a number of strategies commonly employed to simulate the performance of an integrated circuit at extremes of the processing technology. Conventional corner simulation involves performing simulations using two sets of device models: high and low (or fast and slow) corner models which represent extremes of the processing technology. Each of the two sets of devices models are developed in turn: The high/fast (low/slow) case is developed by defining an objective circuit parameter, and then skewing device model parameters to their extreme limits observed in production hardware in a way such that the objective circuit parameter is maximized (minimized). For example, defining the target as the characteristic time-constant of an analog circuit would result in device parameters for the fast case being skewed in a way to maximize active device currents, and to otherwise minimize capacitances and resistances.

The advantage of corner simulation is that it provides a quick answer to the designer about whether her circuit will function under process extremes, requiring just two additional simulation iterations for each situation analyzed.

The drawback of this method of corner file generation is that these specific combinations of model parameters do not always yield an extreme in circuit performance for all types of analog applications in complex technologies having several types of devices (i.e., the quick answer obtained with this method could be incorrect). The effects on the performance of a particular circuit caused by skewing a model parameter to one extreme limit may be canceled or reduced by the effect of some other model parameters being skewed.

This type of corner simulation is also referred to in the literature as worst case simulation.

Another strategy for simulating the performance of an integrated circuit over extremes of the processing technology is Monte Carlo simulation. Monte Carlo simulation involves simulating circuit performance using a number of randomly generated sets of device models. Information about how each model parameter varies between their extreme limits is used to set each parameter value, and to generate a full set of device models.

The advantage of Monte Carlo simulation is that it provides an accurate picture of how the circuit will function under variations in processing technology. Monte Carlo simulation has the significant drawback that many simulation iterations are required in order to get a high level of confidence that the circuit will function under extremes of process. It also has the drawback that the model parameter descriptions are difficult to extract, since theoretically, one would need to extract model parameters from a wide variety of hardware to accurately determine device model parameter variation.

Another approach, used to simplify model parameter descriptions for Monte Carlo models, is to use physically based model parameter formulation. With this technique of model generation, knowledge about how model parameters are affected by physical technology parameters that are relatively easy to characterize is exploited to develop statistically varying models. Knowledge about the tolerance with which polysilicon lines can be deposited, for example, is used to determine the variations of NFET and PFET effective channel length and polysilicon resistor width model parameters, both of which are directly proportional to the physical polysilicon line width variation. Using physically based model parameters greatly reduces the amount of hardware which needs to be characterized in order to develop accurate Monte Carlo device models.

BRIEF SUMMARY OF THE INVENTION

An object of this invention is to provide a simulation approach having some of the benefits of both conventional corner simulation and Monte Carlo simulation.

Another object of the present invention is to provide an approach for simulating integrated circuits that allows a great degree of flexibility with respect to determining a specific corner file definition.

These and other objectives are attained with a method and system for creating a worst case scenario model for a given integrated circuit. The method comprises the steps of sorting skew parameters of each device into groups; and assigning a positive or negative value for each one of the groups to represent the effect of the corresponding skew parameters on the functionality of the integrated circuit.

The preferred embodiment of the invention, described below in detail, provides some of the benefits of both conventional corner simulation and Monte Carlo simulation. This approach can be implemented with only a few additional simulation iterations, which mitigates the disadvantage of Monte Carlo simulations requiring many simulation iterations. Also, this approach allows a greater degree of flexibility with respect to determining a specific corner file definition, allowing the designer to explore a greater area of model parameter space to insure that the circuit will meet performance requirements over extremes of process technology variation. This approach is easily applied when the device models are physically based, i.e. most of the device model parameters are defined in terms of physical process parameters such as dimension, resistance, capacitances. It is also assumed that the dominant statistically varying process parameters and model parameters have been defined using appropriate statistical functions based on hardware characterization data and line control targets so that full statistical models are available for a given technology.

Further benefits and advantages of the invention will become apparent from a consideration of the following detailed description, given with reference to the accompanying drawings, which specify and show preferred embodiments of the invention.

DETAILED DESCRIPTION OF THE INVENTION

This invention, generally, involves grouping together sets of model parameters which affect a single device or group of devices. This allows the designer more control over customizing a specific corner file to stress his design at specific extremes of process.

Figure 1:
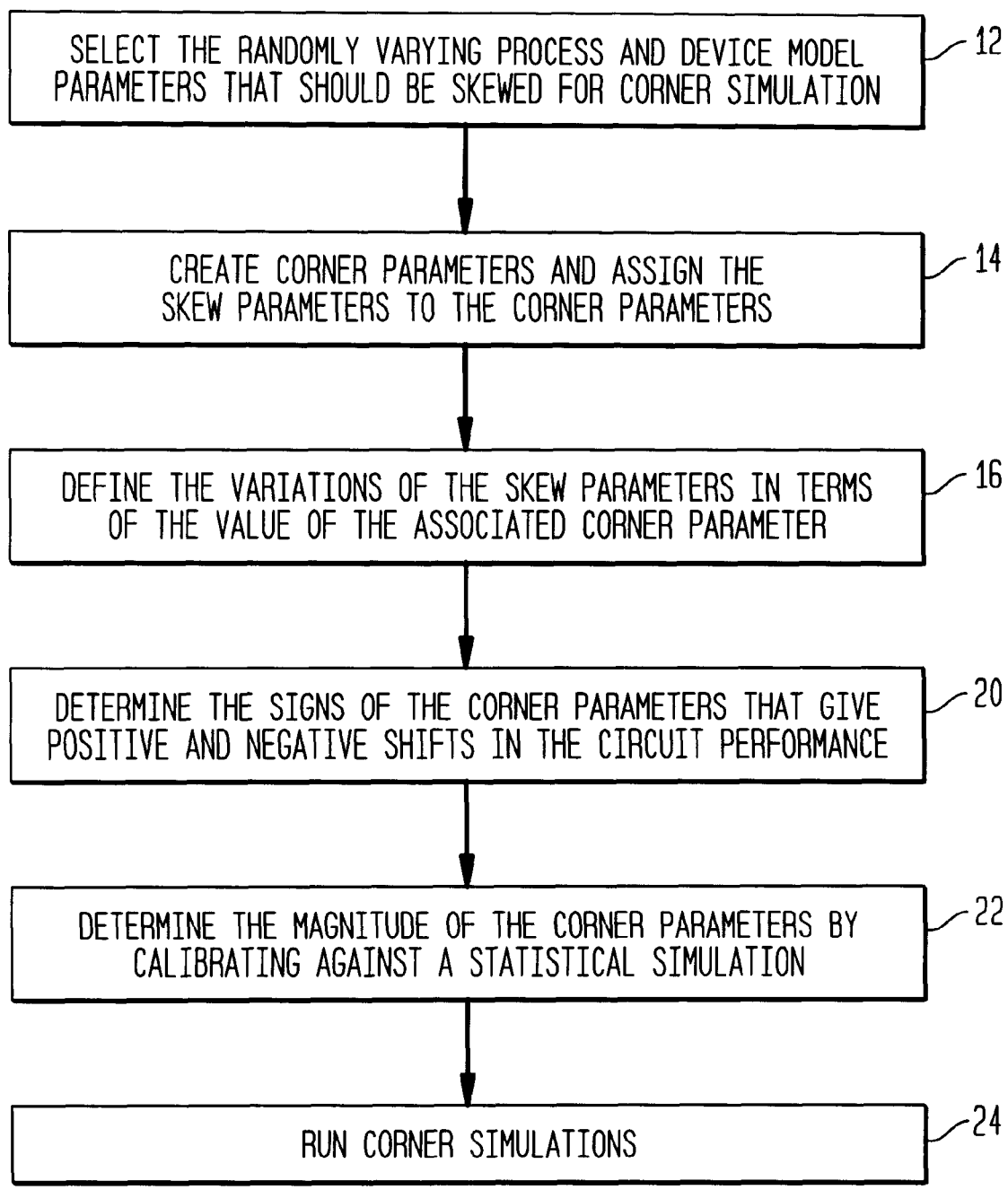
FIG. 1 is a flow chart showing a preferred method embodying this invention.

A flow diagram of the creation and the use a preferred corner simulation methodology is given in FIG. 1. The steps are described below with some examples.

Building Corner models:

Step 12 is to select the randomly varying process and device parameters that affect the device characteristics in non-trivial manner. These parameters will be skewed (changed) for corner simulations.

At step 14, one corner parameter is created for each device type. Devices used for similar applications may be grouped together with a single corner parameter, such as different types of resistors. If more than one device types share several dominant skew parameters, these devices are also associated with a single corner parameter.

The skew parameters that are used in the device models are finally assigned to (or associated with or grouped with) the corner parameters. Most skew parameters affect only one device type. Therefore they are assigned to the corner parameter associated with that device. If devices in more than one corner parameter share a skew parameter, the skew parameter is kept with the corner parameter where the effect of its variation is most dominant on the device performance. If a skew parameter affects devices in more than one corner parameter in dominant manner, a corner parameter is created containing only that skew parameter.

At step 16, the skew parameter variations are defined in terms of the corner parameter. For example, the value, VAL1, of a skew parameter may be defined as follows:

$$VAL1 = MEAN1 \pm SIGMA1 \times Corner\_parameter$$

where MEAN1 and SIGMA1 are the mean and the standard deviation of the skew parameter. The sign before the second term on the right side of the equation is made such that a positive variation of the corner parameter moves the device characteristics of interest in the positive direction. For example, if an increase in the value of a skew parameter gives an increase in the device characteristics, this sign would be made positive. It can be seen from the above equation that a zero value of the corner parameter gives the mean value of the skew parameter, giving nominal characteristics, and a value of x moves the skew parameter by x times its sigma (standard deviation). The above procedure gives a small set of corner parameters which can be used as handles to vary (dial) the characteristics of the different types of devices relatively independent of each other.

Table 1 illustrates the creation of corner parameters for a device set in a typical BiCMOS technology:

TABLE 1

Example of a selection of Corner parameters

| Corner Parameter | Associated Devices | Associated Skew Parameters | Effect of Positive Corner Parameter on Device Characteristics |
|---|---|---|---|
| Corner_bipolar | npn, varactor | Emitter resistance, base pinch resistance, collector epitaxial thickness, collector capacitance etc. | High current, high speed |

TABLE 1-continued

Example of a selection of Corner parameters

| Corner Parameter | Associated Devices | Associated Skew Parameters | Effect of Positive Corner Parameter on Device Characteristics |
|---|---|---|---|
| Corner_nfet | nfet | N-threshold voltage, N-mobility, N-junction capacitance etc. | High current, high speed |
| Corner_pfet | pfet | P-threshold voltage, P-mobility, P-junction capacitance etc. | High current, high speed |
| Corner_res | Resistors | Sheet resistance, end resistance etc. | High resistance |
| Corner_cap | Capacitors | unit capacitance, image shrinkage etc. | High capacitance |
| Corner_ind | Inductors | Sheet resistivity, line width shrinkage etc. | High Q |
| Corner_tox | nfet, pfet | oxide thickness | High current and capacitance |
| Corner_glength | nfet, pfet | gate length shrinkage | High current |
| Corner_gwidth | nfet, pfet | gate width shrinkage | High current |

In the above example, oxide thickness skew parameter is not associated with Corner_nfet or Corner_pfet corner parameters, but with an independent corner parameter Corner_tox, since this skew parameter affects more than one device types (NFET and PFET) in a dominant manner. This allows one to vary the corner parameters while maintaining physically realistic correlations between the characteristics of different types of devices.

Building Corner Simulation Case:

Step 20 is to determine the signs of each of the corner parameters that give positive and negative shifts to the circuit performance of interest relative to its nominal value. Nominal simulation is run by setting all the corner parameters to zero value. Then one corner parameter at a time is set non-zero (say 1, giving 1-sigma variation in the affected skew parameters) (while other corner parameters are set to zero value) and comparing the simulation results against the nominal simulation run. This exercise is repeated for both signs (using +1 and −1 values, for example) of each of the corner parameters. It should be noted that only one corner parameter is set non-zero at a time. The total number of simulations required would be twice the number of corner parameters. In most cases, the opposite signs of the corner parameters will give opposite shifts in the circuit performance, because the performances of most circuits vary monotonically in the small range of process parameter variations. But if both positive and negative values of the corner parameter shift the circuit performance in the same direction (say negative), the sign that gives the larger shift should be chosen for one shift (negative) and none for the other shift (positive). This step also provides an idea of the circuit performance sensitivity against the type of devices, i.e. whether the circuit is sensitive to bipolar devices, FETs or resistors etc. An example of the outcome of this step is given in Table 2.

TABLE 2

An example of Corner parameter signs determined using circuit simulations for a circuit performance of interest

| Corner Parameter | Sign of the corner parameter required for positive performance shift | Sign of the corner parameter required for negative performance shift |
| --- | --- | --- |
| Corner_bipolar | + | − |
| Corner_nfet | + | − |
| Corner_pfet | − | + |
| Corner_res | − | + |
| Corner_cap | None | − |
| Corner_ind | − | + |
| Corner_tox | − | + |
| Corner_glength | + | − |
| Corner_gwidth | − | + |

Once all the signs of the corner parameters have been determined that give positive and negative shifts to the circuit performance, the next step 22 is to determine the magnitude of the corner parameters. Giving equal weights to the variations in all the types of devices, all the corner parameters are chosen to be of the same magnitude. This magnitude is determined by first finding the 3-sigma variation limits of the circuit performance using a statistical simulation and then setting the corner parameter magnitude to match these limits. The value for the corner parameter with no sign (as determined in step 20) is chosen to be zero, or to get more accurate results (although it may be more cumbersome), determine the value of the corner parameter that gives most extreme value of the circuit performance using re-simulations at finer steps of the corner parameters. After this step, the high and low corner simulation cases may look as given in Table 3.

TABLE 3

An example of Corner parameters values for high and low performance cases, determined by comparing the corner simulation results against a statistical simulation

| Corner Parameter | Value of the corner parameter for high 3-sigma performance shift | Value of the corner parameter for low 3-sigma performance shift |
| --- | --- | --- |
| Corner_bipolar | +1.8 | −1.8 |
| Corner_nfet | +1.8 | −1.8 |
| Corner_pfet | −1.8 | +1.8 |
| Corner_res | −1.8 | +1.8 |
| Corner_cap | 0 | −1.8 |
| Corner_ind | −1.8 | +1.8 |
| Corner_tox | −1.8 | +1.8 |
| Corner_glength | +1.8 | −1.8 |
| Corner_gwidth | +1.8 | +1.8 |

The two corner parameter vectors thus created can be used to simulate high and low circuit performance cases during iterative optimization of the circuit design.

This embodiment of the invention creates corner cases of known probability (3-sigma), and avoids cancellation of the effect of skew parameters by determining the signs and magnitude of their variation for the circuit of interest.

Figure 2:
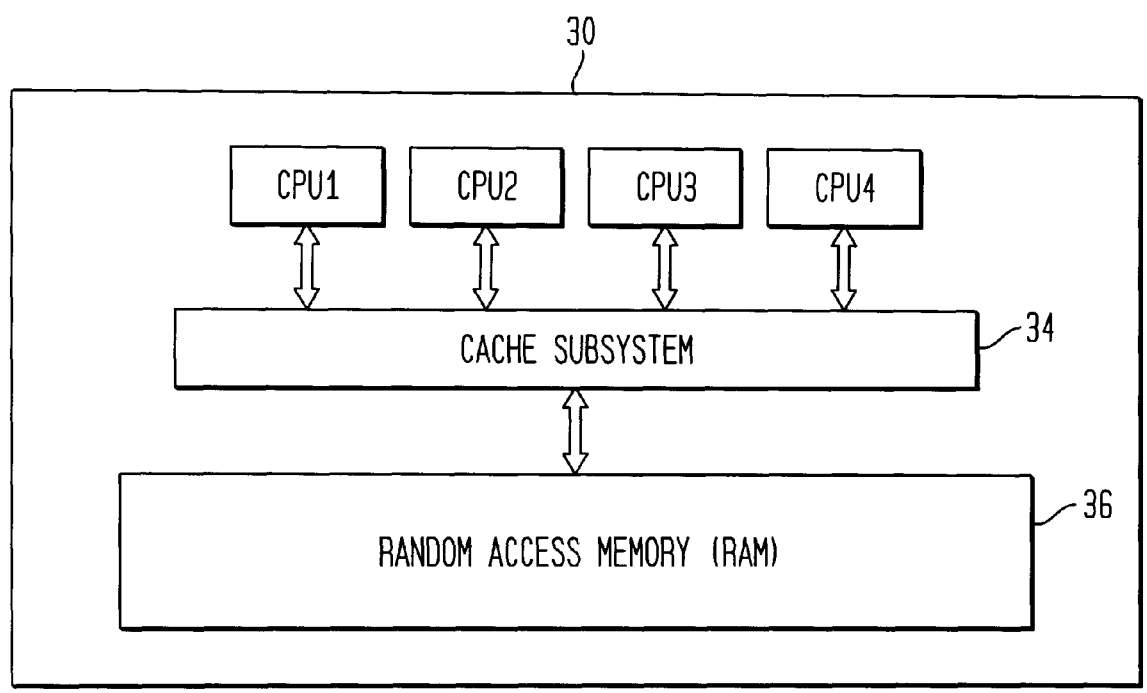
FIG. 2 shows a computer system that may be used in the practice of the invention.
Figure 3:
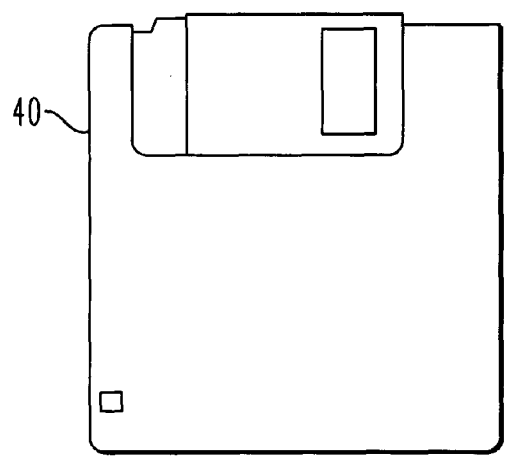
FIG. 3 illustrates a memory medium that can be used to hold a computer program for carrying out this invention.

As will be understood by those skilled in the art, any suitable computing or calculating system or apparatus may be used to practice this invention. For example, a suitable computer system illustrated at 30 in FIG. 2 may be used. System 30, generally, comprises a series of CPUs, a cache subsystem 34, and a random access memory (RAM) 36. Also, as will be understood by those skilled in the art, the present invention may be embodied in a computer program storage device (including software embodied in a magnetic, electrical, optical or other storage device). One suitable storage medium is illustrated, for example, at 40 in FIG. 3.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of creating a worst case scenario model for a given integrated circuit comprised of a set of devices, the method comprising the steps of:
   sorting skew parameters of the devices into groups; and
   assigning a positive or negative value for each one of the groups to represent the effect of the corresponding skew parameters on the functionality of the integrated circuit.

2. A method according to claim 1, further comprising the step of determining a magnitude for each group.

3. A method according to claim 2, wherein the magnitudes for all of the groups have the same absolute value.

4. A method according to claim 3, wherein said absolute value is chosen based on a statistical analysis of the integrated circuit.

5. A method according to claim 1, wherein each group is associated with one or more devices, and each skew parameter is sorted into one of the groups on the basis of the manner in which the parameter affects the one or more devices associated with the group.

6. A method according to claim 5, wherein if one of the skew parameters affects devices in more than one group, then said one of the skew parameters is sorted into the group having the device most affected by said one of the parameters.

7. A method according to claim 5, wherein if one of the skew parameters affects devices in more than one group in a dominant manner, then a new group is created for said one of the skew parameters.

8. A method according to claim 1, wherein each of the skew parameters is assigned to only one of the groups.

9. A method according to claim 1, wherein the integrated circuit includes a multitude of types of devices, and the sorting step includes the step of forming a respective one group for each type of device.

10. A method according to claim 1, wherein the integrated circuit includes a multitude of types of devices, and the sorting step includes the step of forming some groups having more than one type of device.

11. A method according to claim 1, wherein the assigning step includes the steps of,
   for each group,
   creating a corner parameter for the group, and
   defining each skew parameter in the group in terms of the corner parameter created for the group.

12. A system for creating a worst case scenario model for a given integrated circuit comprised of a set of devices, the system comprising:

means for sorting skew parameters of the devices into groups; and means for assigning a positive or negative value for each one of the groups to represent the effect of the corresponding skew parameters on the functionality of the integrated circuit.

13. A system according to claim 12, further comprising means for determining a magnitude for each group.

14. A system according to claim 12, wherein each group is associated with one or more devices, and each skew parameter is sorted into one of the groups on the basis of the manner in which the parameter affects the one or more devices associated with the group.

15. A system according to claim 12, wherein the assigning means includes means for creating a corner parameter for each group, and defining each skew parameter in the group in terms of the corner parameter created for the group.

16. A program storage device readable by machine, tangibly embodying a program of instructions executable by the machine to perform method steps for creating a worst case scenario model for a given integrated circuit comprised of a set of semiconductor devices, the method steps comprising:

sorting skew parameters of the semiconductor devices into groups; and assigning a positive or negative value for each one of the groups to represent the effect of the corresponding skew parameters on the functionality of the integrated circuit.

17. A program storage device according to claim 16, further comprising the step of determining a magnitude for each group.

18. A program storage device according to claim 16, wherein each group is associated with one or more of the semiconductor devices, and each skew parameter is sorted into one of the groups on the basis of the manner in which the parameter affects the one or more semiconductor devices associated with the group.

19. A program storage device according to claim 16, wherein the assigning step includes the steps of, for each group, creating a corner parameter for the group, and defining each skew parameter in the group in terms of the corner parameter created for the group.

* * * * *